United States Patent
Lee et al.

(10) Patent No.: US 8,772,077 B2
(45) Date of Patent: Jul. 8, 2014

(54) METHOD OF FORMING CHALCOGENIDE THIN FILM

(75) Inventors: Ki-Hoon Lee, Kyungki-do (KR); Jung-Wook Lee, Kyungki-do (KR); Dong-Ho You, Kyungki-do (KR)

(73) Assignee: IPS Ltd., Kyungki-do (KR)

( * ) Notice: Subject to any disclaimer, the term of this patent is extended or adjusted under 35 U.S.C. 154(b) by 22 days.

(21) Appl. No.: 12/936,563

(22) PCT Filed: Apr. 16, 2009

(86) PCT No.: PCT/KR2009/001959
§ 371 (c)(1),
(2), (4) Date: Oct. 6, 2010

(87) PCT Pub. No.: WO2009/128655
PCT Pub. Date: Oct. 22, 2009

(65) Prior Publication Data
US 2011/0027976 A1    Feb. 3, 2011

(30) Foreign Application Priority Data

Apr. 18, 2008 (KR) .................. 10-2008-0035885

(51) Int. Cl.
*H01L 21/00* (2006.01)

(52) U.S. Cl.
USPC ........ 438/95; 438/102; 257/42; 257/E29.089; 257/E31.008; 257/E31.029; 257/E21.068

(58) Field of Classification Search
USPC .............. 438/95, 102; 257/42, E29.089, 257/E31.029, E31.008, E21.068
See application file for complete search history.

(56) References Cited

U.S. PATENT DOCUMENTS

2006/0124151 A1   6/2006   Yamasaki et al.
2006/0172068 A1*  8/2006   Ovshinsky ................. 427/248.1
(Continued)

FOREIGN PATENT DOCUMENTS

JP   2006-214005 A   8/2006
JP   2007-294964 A   11/2007
(Continued)

OTHER PUBLICATIONS

International Search Report: PCT/KR2009/001959.

*Primary Examiner* — Su Kim
(74) *Attorney, Agent, or Firm* — Ladas & Parry LLP

(57) ABSTRACT

The present invention concerns a method of forming a chalcogenide thin film for a phase-change memory. In the method of forming a chalcogenide thin film according to the present invention, a substrate with a pattern formed is loaded into a reactor, and a source gas is supplied onto the substrate. Here, the source gas includes at least one source gas selected from germanium (Ge) source gas, gallium (Ga) source gas, indium (In) source gas, selenium (Se) source gas, antimony (Sb) source gas, tellurium (Te) source gas, tin (Sn) source gas, silver (Ag) source gas, and sulfur (S) source gas. A first purge gas is supplied onto the substrate in order to purge the source gas supplied onto the substrate, a reaction gas for reducing the source gas is then supplied onto the substrate, and a second purge gas is supplied onto the substrate in order to purge the reaction gas supplied onto the substrate. At least one operation, namely changing the supply time of the first purge gas and/or adjusting the internal pressure of the reactor is performed in such a way as to ensure that the deposition rate at an inner portion of the pattern is greater than the deposition rate at an upper portion of the pattern. According to the present invention, it is possible to form a chalcogenide thin film having an excellent gap-fill property by changing the purge time of the source gas or adjusting the internal pressure of the reactor in such a way as to ensure that the film forming rate at the inner portion of the pattern is greater than the film forming rate at the upper portion of the pattern.

12 Claims, 8 Drawing Sheets

(56) References Cited

U.S. PATENT DOCUMENTS

2007/0151861 A1* 7/2007 Xi et al. .................. 205/183
2007/0246743 A1 10/2007 Cho et al.
2008/0017841 A1* 1/2008 Lee et al. .................... 257/2
2008/0054244 A1* 3/2008 Lee et al. .................... 257/3
2008/0090326 A1* 4/2008 Shin et al. ................ 438/102

FOREIGN PATENT DOCUMENTS

| KR | 1020060076262 A | 7/2006 |
| KR | 1020070025612 A | 3/2007 |
| KR | 100773753 B1 | 10/2007 |
| WO | 2007/133837 A2 | 11/2007 |

* cited by examiner

Figure 3
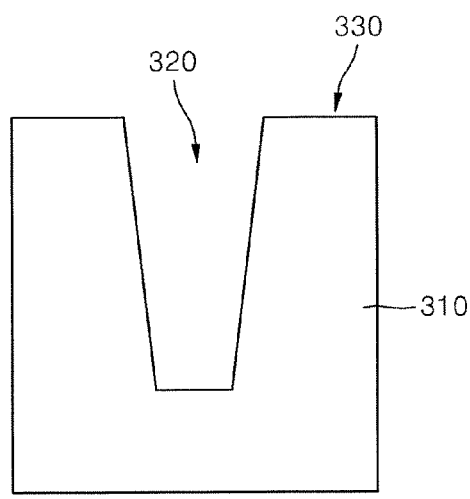
[Figure 4]
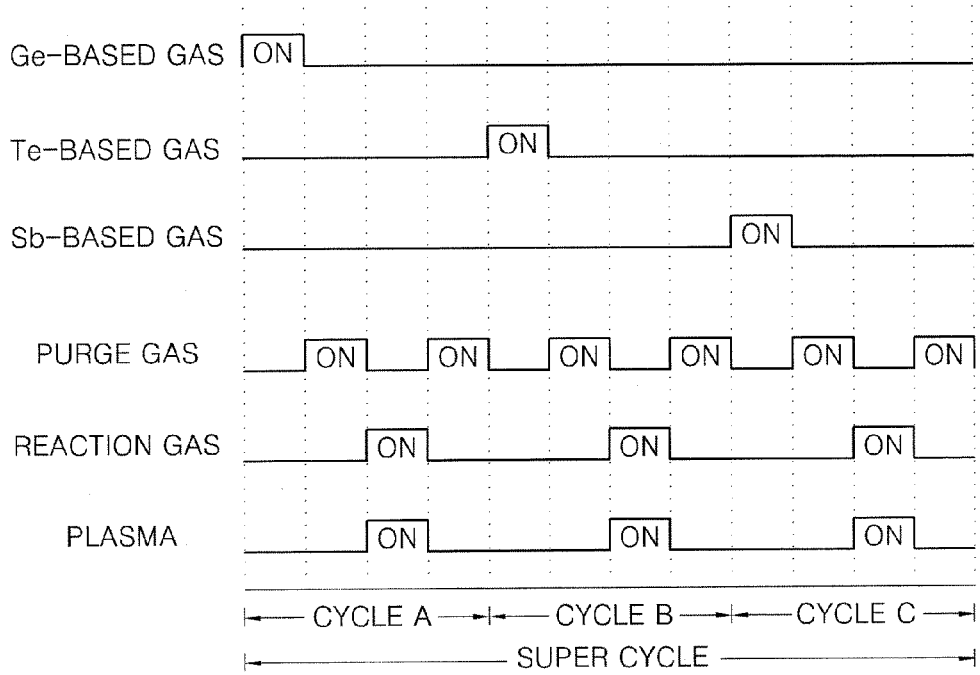

METHOD OF FORMING CHALCOGENIDE THIN FILM

TECHNICAL FIELD

The present invention relates to a method of forming a thin film for use in a semiconductor device, and more particularly, to a method of forming a chalcogenide thin film.

BACKGROUND ART

With the remarkable development of information communication industry, needs for various memory devices are increasing. In particular, nonvolatile memory devices in which recorded data is not deleted even when power is cut off, are needed for portable terminals or MP3 players. A phase change random access memory (PRAM) device that uses a phase change phenomenon is being briskly researched as a nonvolatile memory device. Thus, a chalcogenide thin film in which a phase change phenomenon occurs, is being researched. Meanwhile, as semiconductor devices are highly integrated, a method of forming a chalcogenide thin film that has an excellent step coverage and an excellent gap-fill characteristic, in patterns having a large aspect ratio is required.

Conventional methods of forming a chalcogenide thin film may be performed by sputtering, chemical vapor deposition (CVD) or atomic layer deposition (ALD). When the chalcogenide thin film is formed by sputtering, a step coverage or gap-fill characteristic is deteriorated, and a small amount of carbon (C) or nitrogen (N) cannot be doped into the chalcogenide thin film. On the other hand, when the chalcogenide thin film is formed by CVD, the composition of patterns is not adjusted. In addition, when the chalcogenide thin film is formed by ALD, a deposition rate is reduced to about 0.3 Å/cycle and productivity is very low.

DETAILED DESCRIPTION OF INVENTION

Technical Problem

The present invention provides a method of forming a chalcogenide thin film that has an excellent gap-fill characteristic.

Technical Solution

According to an aspect of the present invention, there is provided a method of forming a chalcogenide thin film, the method including: loading a substrate in which a pattern is formed, into a reactor; supplying a source gas to the substrate; supplying a first purge gas to the substrate so as to purge the source gas supplied to the substrate; supplying a reaction gas that is used to reduce the source gas, to the substrate; supplying a second purge gas to the substrate so as to purge the reaction gas supplied to the substrate; and repeatedly performing a cycle comprising the supplying of the source gas through the supplying of the second purge gas, wherein the source gas is formed of one or more selected from the group including germanium (Ge)-based gas, gallium (Ga)-based gas, indium (In)-based gas, selenium (Se)-based gas, antimony (Sb)-based gas, tellurium (Te)-based gas, tartar (Sn)-based gas, silver (Ag)-based gas, and sulfur (S)-based gas, and wherein at least one of operations of varying time at which the first purge gas is supplied and adjusting pressure inside the reactor is performed so that a deposition rate of an inside of the pattern is greater than a deposition rate of an upper portion of the pattern.

Advantageous Effects

According to an exemplary embodiment, chalcogenide thin film having an excellent gap-fill characteristic may be formed.

DESCRIPTION OF DRAWINGS

FIG. 3 schematically illustrates the shape of a pattern formed in a semiconductor substrate;

FIGS. 4 through 6 schematically illustrate an order of supplying a Ge-based gas, a Sb-based gas, a Te-based gas, a reaction gas, and a purge gas in the method of forming a Ge—Sb—Te compound thin film illustrated in FIG. 2, according to embodiments of the present invention;

BEST MODE

Figure 1:
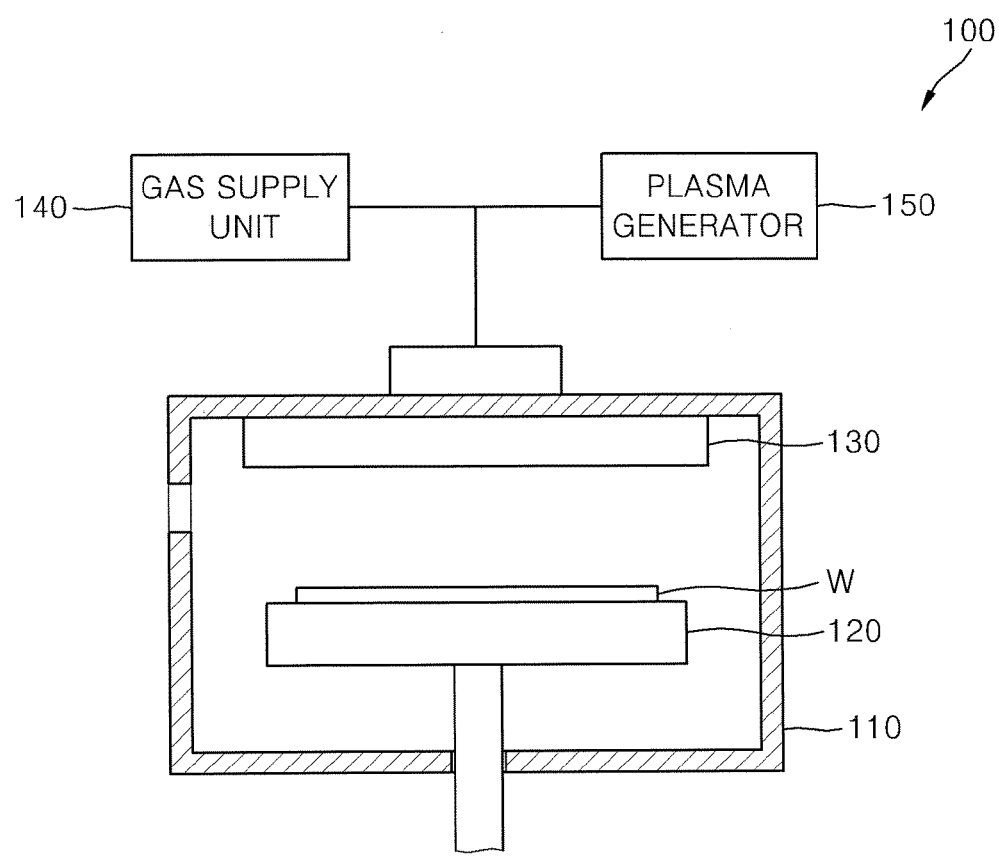
FIG. 1 is a view schematically showing a thin film deposition apparatus performing a method of forming a chalcogenide thin film, according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

First, a method of forming a chalcogenide thin film according to the present invention may be performed using a thin film deposition apparatus 100 illustrated in FIG. 1 according to an embodiment of the present invention.

FIG. 1 is a view schematically showing a thin film deposition apparatus performing a method of forming a chalcogenide thin film, according to an embodiment of the present invention;

Referring to FIG. 1, the thin film deposition apparatus 100 according to the present embodiment includes a reactor 110 having an inside, a substrate support 120, which is installed at the inside of the reactor 110 to ascend thereon and on which a semiconductor substrate W is disposed, and a shower head 130, which sprays gas so that a thin film is formed on the semiconductor substrate W disposed on the substrate support 120.

The thin film deposition apparatus 100 is used to deposit the chalcogenide thin film onto the semiconductor substrate W such as a silicon wafer, and further includes a gas supply unit 140 that supplies a source gas into the reactor 110 via a gas line. In this case, the source gas may be formed of one or more selected from the group including germanium (Ge)-based gas, gallium (Ga)-based gas, indium (In)-based gas, selenium (Se)-based gas, antimony (Sb)-based gas, tellurium (Te)-based gas, tartar (Sn)-based gas, silver (Ag)-based gas, and sulfur (S)-based gas. The chalcogenide thin film may be formed of one or more material selected from the group including a Ge—Sb—Te compound, GaSb, InSb, InSe, $Sb_2Te_3$ GeTe, $Ge_2Sb_2Te_5$, InSbTe, GaSeTe, $Sn_5b_2Te_4$, InSbGe, AgInSbTe, (GeSn)SbTe, GeSb(SeTe), and $Te_{81}Ge_{15}Sb_2S_2$. When the chalcogenide thin film is a Ge—Sb—Te compound thin film, the gas supply unit 140 includes a unit for supplying the Ge-based material, the Sb-based gas, and the Te-based gas into the reactor 110. The gas supply unit 140 includes a unit for supplying a reaction gas and an inert gas, which are used to reduce the source gas, into the reactor 110.

The thin film deposition apparatus 100 may further include another equipment (not shown in FIG. 1) so as to form the chalcogenide thin film by chemical vapor deposition (CVD) or atomic layer deposition (ALD). In particular, in order for ALD to be used, the gas supply unit 140 may further include a unit for alternately supplying the source gas, the reaction gas, and the inert gas into the reactor 110.

The thin film deposition apparatus 100 further includes a plasma generator 150. The plasma generator 150 generates remote plasma and supplies the generated remote plasma into the reactor 110. Except for including of the plasma generator 150 for generating plasma, the thin film deposition apparatus 100 may include a unit (not shown) for applying radio frequency (RF) and/or direct current (DC) power to the shower head 130 and/or the substrate support 120 to generate direct plasma in the reactor 110.

Figure 2:
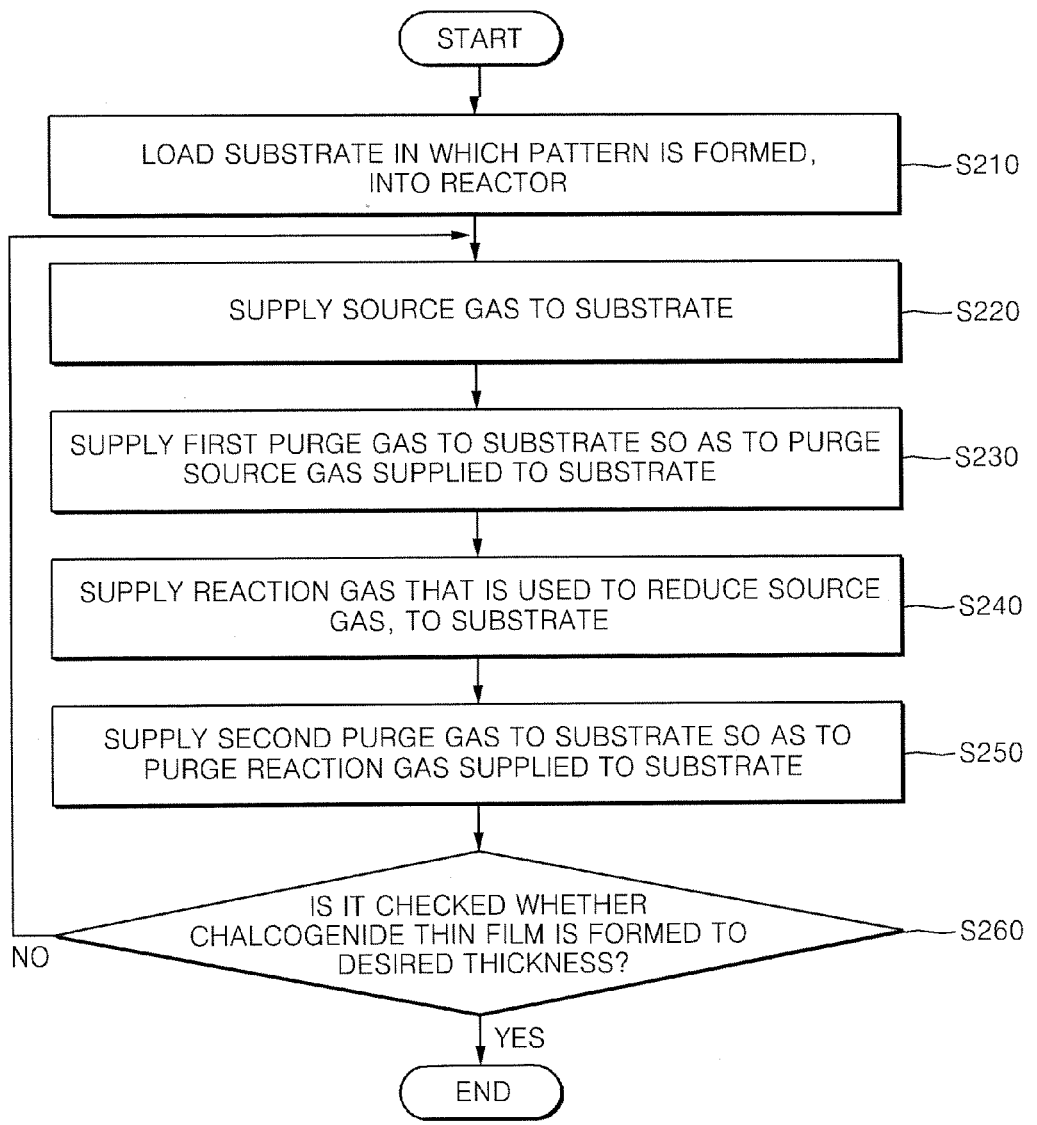
FIG. 2 is a flowchart illustrating a method of forming a chalcogenide thin film according to an embodiment of the present invention.

FIG. 2 is a flowchart illustrating a method of forming a chalcogenide thin film according to an embodiment of the present invention.

Referring to FIG. 2, in operation S210, the semiconductor substrate W in which a pattern 310 is formed, is loaded into the reactor 110. FIG. 3 schematically illustrates the shape of the pattern 310 formed in the semiconductor substrate W. Next, in operation S220, the source gas is supplied to the semiconductor substrate W. In this regard, the source gas may be formed of one or more selected from the group including germanium (Ge)-based gas, gallium (Ga)-based gas, indium (In)-based gas, selenium (Se)-based gas, antimony (Sb)-based gas, tellurium (Te)-based gas, tartar (Sn)-based gas, silver (Ag)-based gas, and sulfur (S)-based gas. The chalcogenide thin film may be formed of one or more material selected from the group including a Ge—Sb—Te compound, GaSb, InSb, InSe, $Sb_2Te_3$ GeTe, $Ge_2Sb_2Te_5$, InSbTe, GaSeTe, $Sn_5b_2Te_4$, InSbGe, AgInSbTe, (GeSn)SbTe, GeSb(SeTe), and $Te_{81}Ge_{15}Sb_2S_2$.

Hereinafter, a method of forming a Ge—Sb—Te compound thin film, which is a representative material of a chalcogenide compound, will be described. When a chalcogenide thin film to be formed is a Ge—Sb—Te compound thin film, the source gas is formed of one or more selected from the group including the Ge-based gas, the Sb-based gas, and the Te-based gas. In this regard, a metalorganic precursor may be used to form the Ge-based gas, the Sb-based gas, and the Te-based gas. When the metalorganic precursor is used to form the Ge-based gas, the Sb-based gas and the Te-based gas, the Ge-based gas, the Sb-based gas, and the Te-based gas contain carbon (C) and nitrogen (N). Thus, even though additional C and N doping is not performed, a small amount of C and N is doped into the Ge—Sb—Te compound thin film.

The Ge-based gas may be one or more selected from the group including compounds, among metalorganic precursors, represented by the following Formulae 1 through 4

wherein $R_1$ through $R_5$ are each $C_nH_{2n+1}$ or $N(C_nH_{2n+1}.C_mH_{2m+1})$, $R_6$ through $R_{11}$ are each any one of H, $C_nH_{2n+1}$, and $N(C_nH_{2n+1}.C_mH_{2m+1})$, and n and m are natural numbers.

In the related art, a compound $Ge(C_4H_9)_4$ or $GeH(C_4H_9)_3$ is used to form the Ge-based gas. The Ge-based gas used in the present invention has a form in which a ligand is substituted by hydrogen atoms. Thus, the volume of the Ge-based gas is smaller than that of a Ge-based gas used in the related art. Thus, the number of the Ge-based gas that can be chemically and physically absorbed into the surface of the semiconductor substrate W per unit area increases. The volume of the Ge-based gas reduces, and it is easy to absorb the Ge-based gas into an inside 320 of the pattern 310 having a large aspect ratio compared to the Ge-based gas used in the related art.

In addition, the Ge-based gas used in the present invention as described above has a form in which a ligand is substituted by hydrogen atoms. Thus, the Ge-based gas used in the present invention has a weak coherence with the semiconductor substrate W compared to the Ge-based gas used in the related art. Thus, a desorption coefficient of the Ge-based gas used in the present invention increases compared to the Ge-based gas used in the related art. Thus, a relatively large amount of the Ge-based gas used in the present invention compared to the Ge-based gas used in the related art is purged by a first purge gas in a purge process S230 that will be described later. In particular, an upper portion 330 of the pattern 310 is well purged compared to the inside 320 of the pattern 310. Thus, the deposition rate of the upper portion 330 of the pattern 310 is rapidly reduced due to the purge gas. On the other hand, the deposition rate of the inside 320 of the pattern 310 is relatively slightly reduced. As a result, when the compounds represented by Formulae 1 through 4 are used to form the Ge-based gas, the Ge—Sb—Te compound thin film having an excellent gap-fill characteristic may be formed.

The Sb-based gas may be a compound, among metalorganic precursors, represented by the following Formula 5.

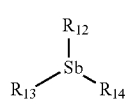

(5)

wherein, $R_{12}$ through $R_{14}$ are each any one of H, $C_nH_{2n+1}$ and $N(C_nH_{2n+1}.C_mH_{2m+1})$ and n and m are natural numbers.

The Te-based gas may be a compound, among metalorganic precursors, represented by the following Formula 6.

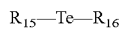

(6)

wherein $R_{15}$ and $R_{16}$ are each any one of H, $C_nH_{2n+1}$ and $N(C_nH_{2n+1}.C_mH_{2m+1})$ and n and m are natural numbers.

In operation S230, the first purge gas is supplied to the semiconductor substrate W so as to purge the source gas. In this regard, the first purge gas may be $N_2$, argon (Ar), helium (He), and a combination thereof.

Next, in operation S240, the reaction gas that is used to reduce the source gas is supplied to the semiconductor substrate W. In this regard, the reaction gas may be a compound containing hydrogen (H) and may be a $H_2$ gas, for example. When the reaction gas is supplied to the semiconductor substrate W, plasma may be generated in the reactor 110. To this end, the plasma generator 150 included in the thin film deposition apparatus 100 generates remote plasma to supply the remote plasma into the reactor 110. Direct plasma may be generated in the reactor 110 by using a unit (not shown) for applying radio frequency (RF) and/or direct current (DC) power to the gas supply unit 130 and/or the substrate support 120.

In operation S250, a second purge gas is supplied to the semiconductor substrate W so as to purge the supplied reaction gas. In this regard, the second purge gas may be $N_2$, argon (Ar), helium (He), and a combination thereof, like in the first purge gas.

In operation S260, it is checked whether a chalcogenide thin film is formed to a desired thickness. If the chalcogenide thin film is not formed to the desired thickness, operations S220 through S250 are sequentially repeatedly performed. If operations S220 through S250 are repeatedly performed, operation S220 of supplying the source gas to the semiconductor substrate W may be varied. For example, when the Ge—Sb—Te compound thin film is formed, if in first operation S220, the Ge-based gas has been supplied to the semiconductor substrate W, in next operation S220, the Sb-based gas may be supplied to the semiconductor substrate W, and in next operation S220, the Te-based gas may be supplied to the semiconductor substrate W. In this way, when the Ge—Sb—Te compound thin film is formed, an order of supplying the Ge-based gas, the Sb-based gas, and the Te-based gas is shown in FIGS. 4 through 6 according to other embodiments of the present invention.

Figure 5:
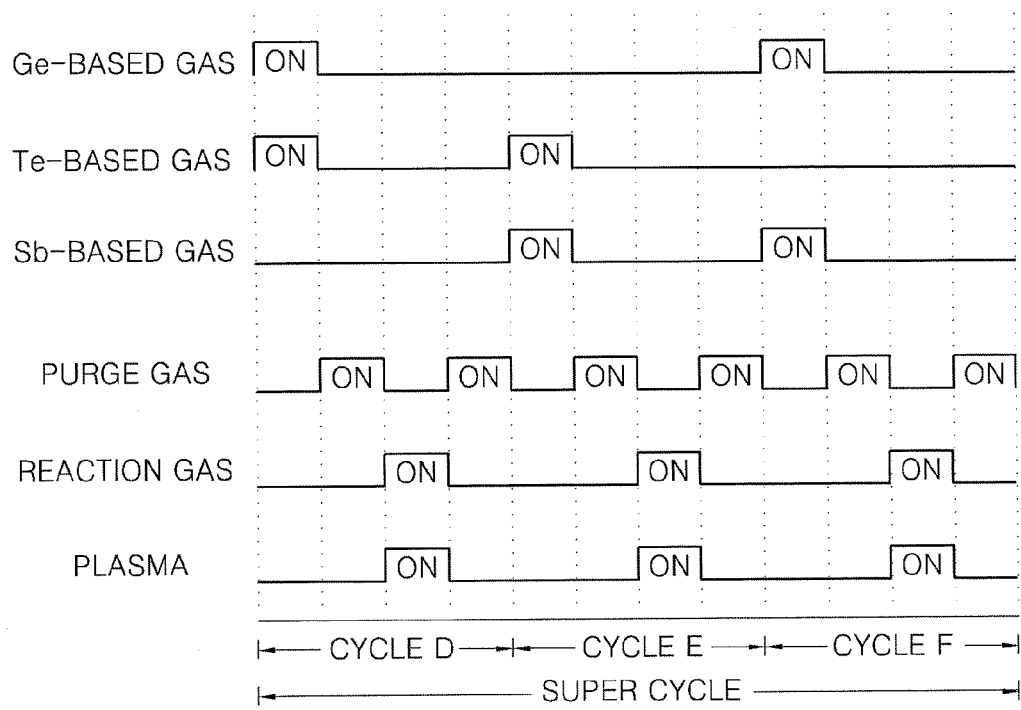
Figure 6:
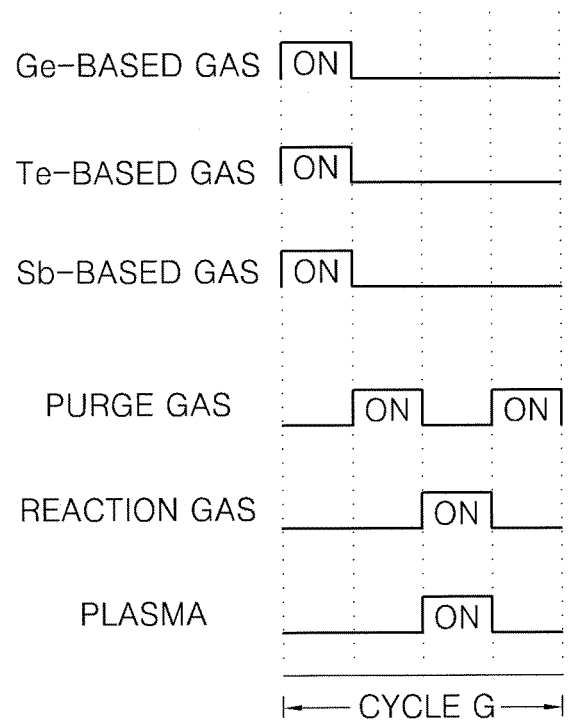

FIGS. 4 through 6 schematically illustrate an order of supplying the Ge-based gas, the Sb-based gas, the Te-based gas, the reaction gas, and the purge gas in the method of forming the Ge—Sb—Te compound thin film illustrated in FIG. 2, according to embodiments of the present invention. FIGS. 4 through 6 illustrate embodiments of a purge gas in which the first purge gas and the second purge gas are the same.

Referring to FIG. 4 as an embodiment, first, the source gas formed of the Ge-based gas is supplied to the semiconductor substrate W (S220), and the purge gas is supplied to the semiconductor substrate W so as to purge the Ge-based gas (S230), and the reaction gas that is used to reduce the Ge-based gas is supplied to the semiconductor substrate W (S240), and last, the purge gas is supplied to the semiconductor substrate W so as to purge the reaction gas (S250). This procedure corresponds to a cycle A. Next, the source gas formed of the Te-based gas is supplied to the semiconductor substrate W (S220), and the purge gas is supplied to the semiconductor substrate W so as to purge the Te-based gas (S230), and the reaction gas that is used to reduce the Te-based gas is supplied to the semiconductor substrate W (S240), and last, the purge gas is supplied to the semiconductor substrate W so as to purge the reaction gas (S250). This procedure corresponds to a cycle B. Next, the source gas formed of the Sb-based gas is supplied to the semiconductor substrate W (S220), and the purge gas is supplied to the semiconductor substrate W so as to purge the Sb-based gas (S230), and the reaction gas that is used to reduce the Sb-based gas is supplied to the semiconductor substrate W (S240), and last, the purge gas is supplied to the semiconductor substrate W so as to purge the reaction gas (S250). This procedure corresponds to a cycle C. When the reaction gas is supplied to the semiconductor substrate W in each of the cycles A, B, and C (S240), plasma is generated in the reactor 110.

The cycles A, B, and C constitute one super cycle, and the super cycle is performed until the chalcogenide thin film is formed to a desired thickness. In this way, the source gas formed of any one of the Ge-based gas, the Sb-based gas, and the Te-based gas is supplied to the semiconductor substrate W in one of the cycles A, B, and C so that the Ge—Sb—Te compound thin film can be formed.

Referring to FIG. 5 as another embodiment, first, the source gas formed of a combination of the Ge-based gas and the Te-based gas is supplied to the semiconductor substrate W (S220), and the purge gas is supplied to the semiconductor substrate W so as to purge the Ge-based gas and the Te-based gas (S230), and the reaction gas that is used to reduce the Ge-based gas and the Te-based gas is supplied to the semiconductor substrate W (S240), and last, the purge gas is supplied to the semiconductor substrate W so as to purge the reaction gas (S250). This procedure corresponds to a cycle D. Next, the source gas formed of a combination of the Te-based gas and the Sb-based gas is supplied to the semiconductor substrate W (S220), and the purge gas is supplied to the semiconductor substrate W so as to purge the Te-based gas and the Sb-based gas (S230), and the reaction gas that is used to reduce the Te-based gas and the Sb-based gas is supplied to the semiconductor substrate W (S240), and last, the purge gas is supplied to the semiconductor substrate W so as to purge the reaction gas (S250). This procedure corresponds to a cycle E. Next, the source gas formed of a combination of the Ge-based gas and the Sb-based gas is supplied to the semiconductor substrate W (S220), and the purge gas is supplied to the semiconductor substrate W so as to purge the Ge-based gas and the Sb-based gas (S230), and the reaction gas that is used to reduce the Ge-based gas and the Sb-based gas is supplied to the semiconductor substrate W (S240), and last, the purge gas is supplied to the semiconductor substrate W so as to purge the reaction gas (S250). This procedure corresponds to a cycle F. When the reaction gas is supplied to the semiconductor substrate W in each of the cycles D, E, and F (S240), plasma is generated in the reactor 110.

The cycles D, E, and F constitute one super cycle, and the super cycle is performed until the chalcogenide thin film is formed to a desired thickness. In this way, the source gas formed of two of the Ge-based gas, the Sb-based gas, and the Te-based gas is supplied to the semiconductor substrate W in one of the cycles D, E, and F so that the Ge—Sb—Te compound thin film can be formed.

Referring to FIG. 6 as another embodiment, first, the source gas formed of a combination of the Ge-based gas, the Te-based gas and the Sb-based gas is supplied to the semiconductor substrate W (S220), and the purge gas is supplied to the semiconductor substrate W so as to purge the Ge-based gas, the Te-based gas and the Sb-based gas (S230), and the reaction gas that is used to reduce the Ge-based gas, the Te-based gas and the Sb-based gas is supplied to the semiconductor substrate W (S240), and last, the purge gas is supplied to the semiconductor substrate W so as to purge the reaction gas (S250). This procedure corresponds to a cycle G. When the reaction gas is supplied to the semiconductor substrate W in the cycle G (S240), plasma is generated in the reactor 110.

Figure 7:
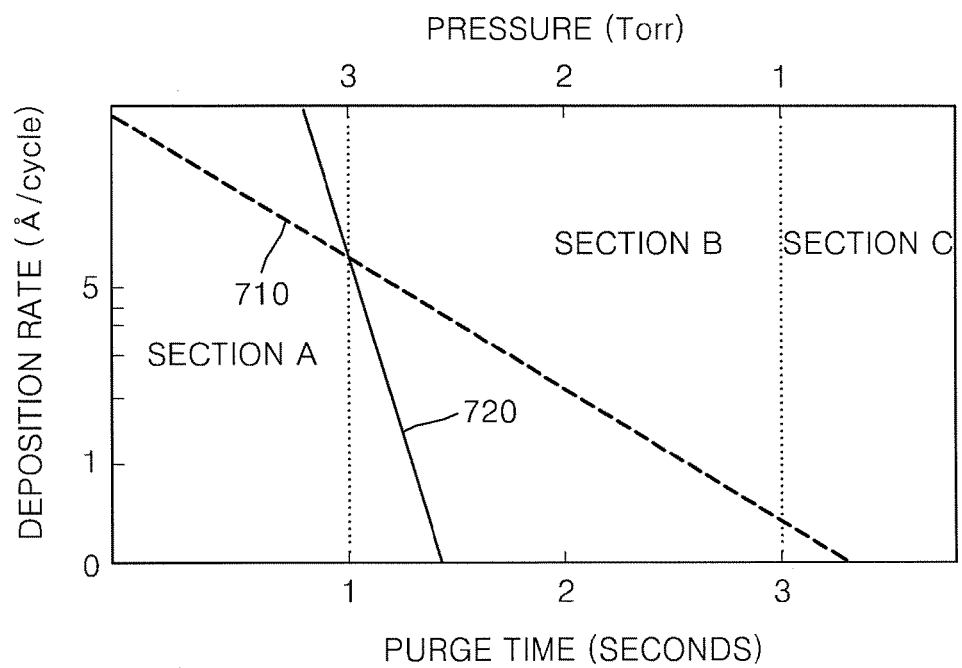
FIG. 7 schematically illustrates a deposition rate of the Ge—Sb—Te compound thin film according to a purge time of the source gas and pressure inside the reactor in the method of forming the Ge—Sb—Te compound thin film illustrated in FIG. 2, according to an embodiment of the present invention.

FIG. 7 schematically illustrates a deposition rate of the Ge—Sb—Te compound thin film according to a purge time of the source gas and pressure inside the reactor 110, in the method of forming the Ge—Sb—Te compound thin film illustrated in FIG. 2, according to an embodiment of the present invention.

Referring to FIG. 7, graph indicated by reference numeral 710 corresponds to the deposition rate of the Ge—Sb—Te compound thin film formed in the inside 320 of the pattern 310. Graph indicated by reference numeral 720 corresponds to the deposition rate of the Ge—Sb—Te compound thin film formed in the upper portion 330 of the pattern 310. In a section A of FIG. 7, the deposition rate of the Ge—Sb—Te compound thin film formed in the upper portion 330 of the pattern 310 is greater than that of the Ge—Sb—Te compound thin film formed in the inside 320 of the pattern 310. In a section B of FIG. 7, the deposition rate of the Ge—Sb—Te compound thin film formed in the inside 320 of the pattern 310 is greater than that of the Ge—Sb—Te compound thin film formed in the upper portion 330 of the pattern 310, and the deposition rate of the Ge—Sb—Te compound thin film formed in the inside 320 of the pattern 310 is greater than 0.5 Å/cycle. In a section C of FIG. 7, the deposition rate of the Ge—Sb—Te compound thin film formed in the inside 320 of the pattern 310 is smaller than 0.5 Å/cycle.

In order to gap-fill the pattern 310 so as not to form voids or seams in the pattern 310, the deposition rate of the Ge—Sb—Te compound thin film formed in the inside 320 of the pattern 310 may be greater than that of the Ge—Sb—Te compound thin film formed in the upper portion 330 of the pattern 310. If the deposition rate of the Ge—Sb—Te compound thin film is smaller than 0.5 Å/cycle, it is not more advantageous than a deposition rate at which ALD is performed. Thus, the deposition rate of the Ge—Sb—Te compound thin film formed in the inside 320 of the pattern 310 may be greater than 0.5 Å/cycle. Thus, in order to form the Ge—Sb—Te compound thin film having an excellent gap-fill characteristic, a purge time and pressure inside the reactor 110 which correspond to the section B of FIG. 7 are required. In FIG. 7, in order to form the Ge—Sb—Te compound thin film, the Ge-based gas is $GeH_3(C_4H_9)$, the Sb-based gas is $Sb(C_3H_7)_3$ and the Te-based gas is $Te(C_3H_7)_2$. In this case, the first purge gas is supplied to the semiconductor substrate W for 1 to 3 seconds under pressure inside the reactor 110 in the range from 1 to 3 torr. When other materials are used as the Ge-based gas, the Sb-based gas and the Te-based gas, specific values of the purge time and pressure inside the reactor 110 may be varied.

Figure 8:
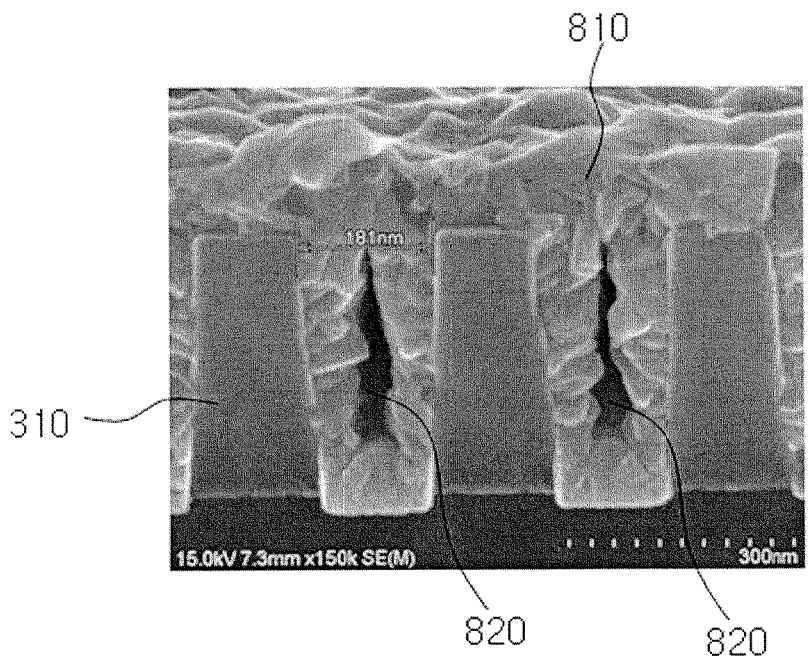
FIG. 8 is a scanning electron microscopy (SEM) photo of the pattern when the pattern is gap-filled at the purge time of the source gas under pressure inside the reactor which correspond to a section A of FIG. 7, according to an embodiment of the present invention.
Figure 9:
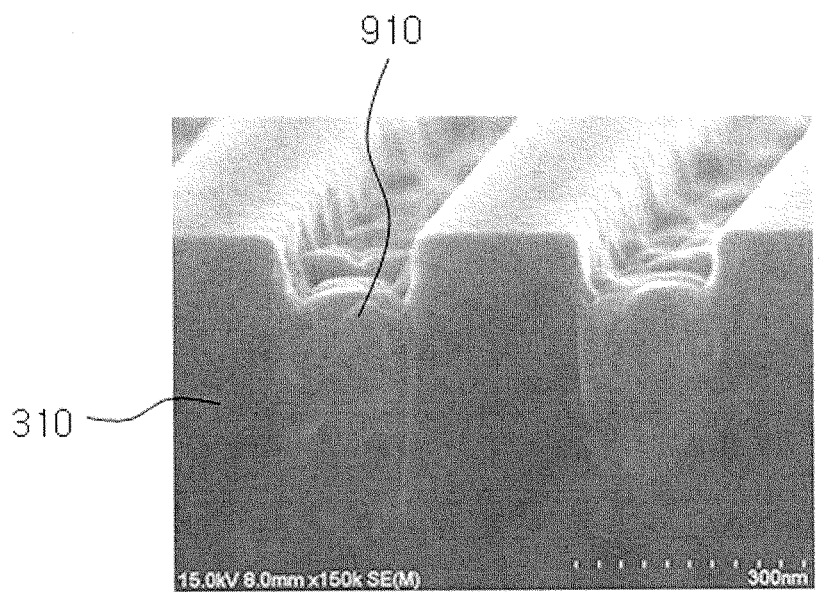
FIG. 9 is a SEM photo of the pattern when the pattern is gap-filled at the purge time of the source gas under pressure inside the reactor which correspond to a section B of FIG. 7, according to an embodiment of the present invention.
Figure 10:
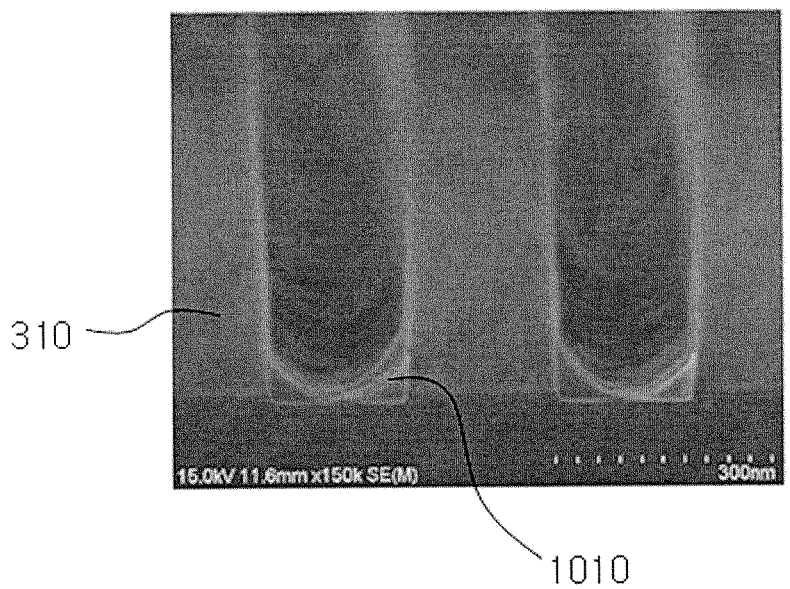
FIG. 10 is a SEM photo of the pattern when the pattern is gap-filled at the purge time of the source gas under pressure inside the reactor which correspond to a section C of FIG. 7, according to an embodiment of the present invention.

FIG. 8 is a scanning electron microscopy (SEM) photo of the pattern 310 when the pattern 310 is gap-filled at the purge time of the source gas under pressure inside the reactor 110 which correspond to the section A of FIG. 7, according to an embodiment of the present invention. FIG. 9 is a SEM photo of the pattern 310 when the pattern 310 is gap-filled at the purge time of the source gas under pressure inside the reactor 110 which correspond to the section B of FIG. 7, according to an embodiment of the present invention. FIG. 10 is a SEM photo of the pattern 310 when the pattern 310 is gap-filled at the purge time of the source gas under pressure inside the reactor 110 which correspond to the section C of FIG. 7, according to an embodiment of the present invention. In this regard, the Ge-based gas is $GeH_3(C_4H_9)$, the Sb-based gas is $Sb(C_3H_7)_3$ and the Te-based gas is $Te(C_3H_7)_2$. in each of the above-stated three cases, the pattern 310 is gap-filled for the same amount of time.

When the pattern 310 is gap-filled on condition of the purge time and pressure inside the reactor 110 which correspond to the section A of FIG. 7, the deposition rate of the Ge—Sb—Te compound thin film formed in the upper portion 330 of the pattern 310 is greater than that of the Ge—Sb—Te compound thin film formed in the inside 320 of the pattern 310, as described above. Thus, a Ge—Sb—Te compound thin film 810 in which voids 820 are formed in the inside 320 of the pattern 310 is deposited, as illustrated in FIG. 8.

When the pattern 310 is gap-filled on condition of the purge time and pressure inside the reactor 110 which correspond to the section B of FIG. 7, the deposition rate of the Ge—Sb—Te compound thin film formed in the inside 320 of the pattern 310 is greater than that of the Ge—Sb—Te compound thin film formed in the upper portion 330 of the pattern 310, as described above. Thus, a Ge—Sb—Te compound thin film 910 is hardly formed in the upper portion 330 of the pattern 310, and the Ge—Sb—Te compound thin film 910 is deposited from the bottom of the inside 320 of the pattern 310 so that voids or seams are not formed in the pattern 310, as illustrated in FIG. 9.

When the pattern 310 is gap-filled on condition of the purge time and pressure inside the reactor 110 which correspond to the section C of FIG. 7, the deposition rate of the Ge—Sb—Te compound thin film formed in the inside 320 or the upper portion 330 of the pattern 310 is smaller than 0.5 Å/cycle, as described above. Thus, a Ge—Sb—Te compound thin film 1010 is hardly formed in the inside 320 or the upper portion 330 of the pattern 310, as illustrated in FIG. 10. Thus, when the pattern 310 is gap-filled on condition of the purge time and pressure inside the reactor 110 which correspond to the section C of FIG. 7, a long process time is required and thus, productivity is lowered.

As such, as illustrated in FIGS. 8 through 10, when the Ge—Sb—Te compound thin film having an excellent gap-fill characteristic is formed to increase its deposition rate, the Ge—Sb—Te compound thin film may be formed on condition of the purge time and pressure inside the reactor 110 which correspond to the section B of FIG. 7.

Figure 11:
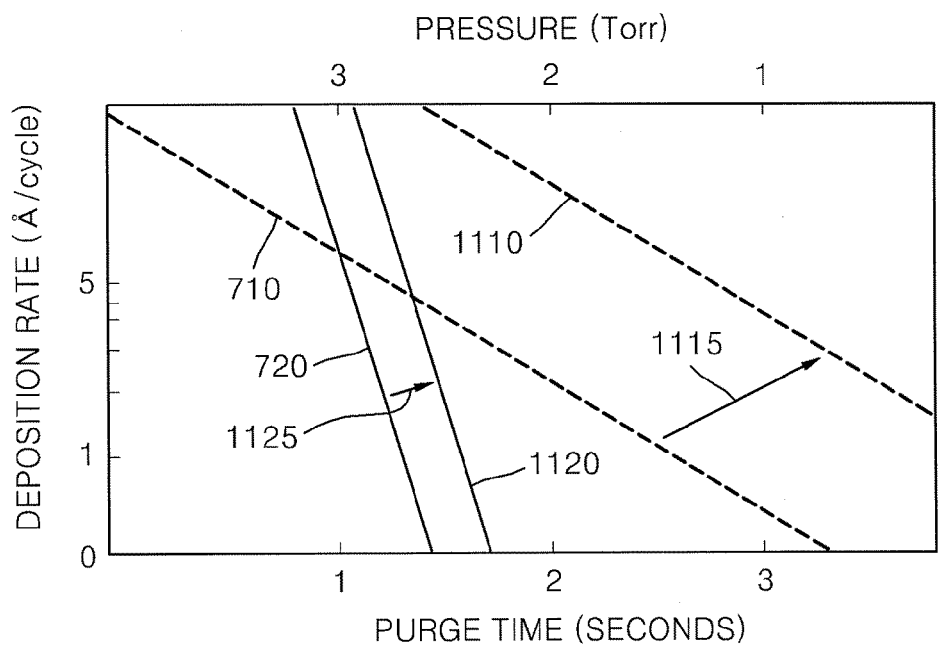
FIG. 11 schematically illustrates the deposition rate of the Ge—Sb—Te compound thin film according to a purge time of the source gas and pressure inside the reactor when a bias voltage is applied to the reactor, according to an embodiment of the present invention.

FIG. 11 schematically illustrates the deposition rate of the Ge—Sb—Te compound thin film according to a purge time of the source gas and pressure inside the reactor 110 when a bias voltage is applied to the reactor 110, according to an embodiment of the present invention. In this regard, the bias voltage may be applied to the reactor 110. Alternatively, the bias voltage may be applied to the shower head 130 or may be applied to the reactor 110 after a grid (not shown) is disposed between the shower head 130 and the substrate support 120. The bias voltage is applied to the reactor 110 so as to vary the characteristic of plasma. Thus, the bias voltage is applied to the reactor 110 in an operation of generating plasma in the reactor 110, i.e., in operation S240 of supplying the reaction gas.

FIG. 11 illustrates both the case where the bias voltage is not applied to the reactor 110 (710, 720) and the case where the bias voltage is applied to the reactor 110 (1110, 1120). Referring to FIG. 11, graphs indicated by reference numerals 710 and 1110 correspond to the deposition rate of the Ge—Sb—Te compound thin film formed in the inside 320 of the pattern 310. Graphs indicated by reference numerals 720 and 1120 correspond to the deposition rate of the Ge—Sb—Te compound thin film formed in the upper portion 330 of the pattern 310. In other words, if the bias voltage is applied to the reactor 110, graph showing the deposition rate of the Ge—Sb—Te compound thin film formed in the inside 320 of the pattern 310 varies as arrow indicated by reference numeral 1115 (710→1110). Graph showing the deposition rate of the Ge—Sb—Te compound thin film formed in the upper portion 330 of the pattern 310 varies as arrow indicated by reference numeral 1125 (720→1120).

As such, if plasma is generated in the reactor 110 and the bias voltage is applied to the reactor 110 in operation S240 of supplying the reaction gas, the deposition rate of the Ge—Sb—Te compound thin film formed in the inside 320 or the upper portion 330 of the pattern 310 increases, as illustrated in FIG. 11. However, the deposition rate of the Ge—Sb—Te compound thin film formed in the inside 320 of the pattern 310 increases more than three times compared to the Ge—Sb—Te compound thin film formed in the upper portion 330 of the pattern 310. Thus, the deposition rate of the Ge—Sb—Te compound thin film formed in the inside 320 of the pattern 310 is greater than that of the Ge—Sb—Te compound thin film formed in the upper portion 330 of the pattern 310, and a process window in which the deposition rate of the Ge—Sb—Te compound thin film corresponds to 0.5 Å/cycle, increases. In other words, as the deposition rate of the Ge—Sb—Te compound thin film increases, the range of condition of an allowable purge time and pressure inside the reactor 110 becomes wide. Thus, productivity is improved and a defective rate is reduced.

Figure 12:
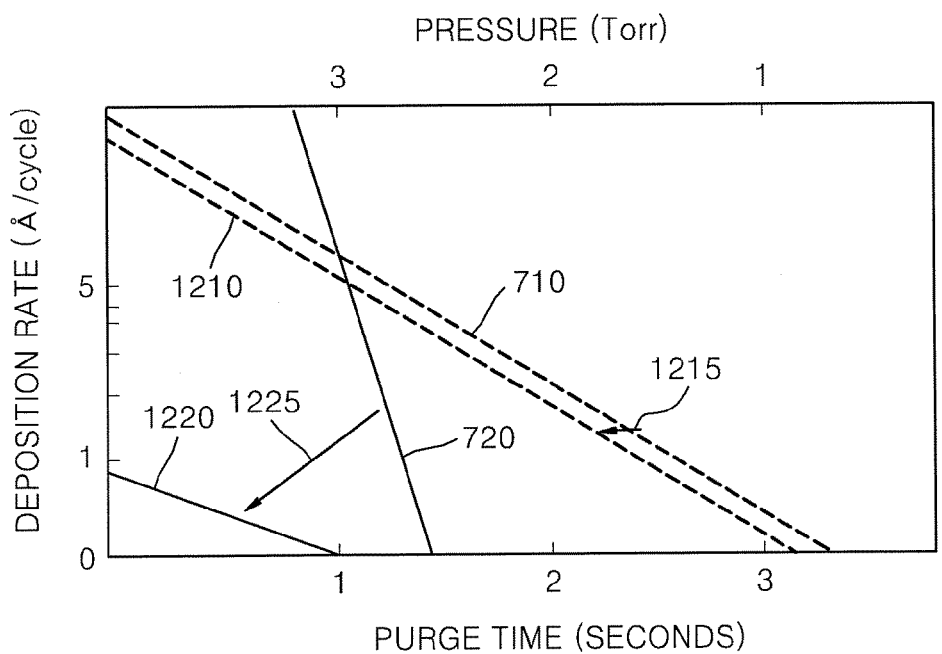
FIG. 12 schematically illustrates the deposition rate of the Ge—Sb—Te compound thin film according to a purge time of the source gas and pressure inside the reactor when the surface of the semiconductor substrate is processed by using gas containing fluorine (F), according to an embodiment of the present invention.

FIG. 12 schematically illustrates the deposition rate of the Ge—Sb—Te compound thin film according to a purge time of the source gas and pressure inside the reactor 110 when the surface of the semiconductor substrate W is processed by using gas containing fluorine (F), according to an embodiment of the present invention. Processing of the surface of the semiconductor substrate W by using the gas containing F is performed between operations S210 and S220. The gas containing F may be NF$_3$.

FIG. 12 illustrates both the case where processing of the surface of the semiconductor substrate W is not performed (710, 720) and the case where processing of the surface of the semiconductor substrate W is performed (1210, 1220). Referring to FIG. 12, graphs indicated by reference numerals 710 and 1210 correspond to the deposition rate of the Ge—Sb—Te compound thin film formed in the inside 320 of the pattern 310. Graphs indicated by reference numerals 720 and 1220 correspond to the deposition rate of the Ge—Sb—Te compound thin film formed in the upper portion 330 of the pattern 310. In other words, if processing of the surface of the semiconductor substrate W is performed, graph showing the deposition rate of the Ge—Sb—Te compound thin film formed in the inside 320 of the pattern 310 varies as arrow indicated by reference numeral 1215 (710→1210). Graph showing the deposition rate of the Ge—Sb—Te compound thin film formed in the upper portion 330 of the pattern 310 varies as arrow indicated by reference numeral 1225 (720→1220).

As such, if the surface of the semiconductor substrate W is processed by using the gas containing F between operations S110 and S220, the deposition rate of the Ge—Sb—Te compound thin film formed in the inside 320 or the upper portion 330 of the pattern 310 is reduced, as illustrated in FIG. 12. However, the deposition rate of the Ge—Sb—Te compound thin film formed in the inside 320 of the pattern 310 is slightly reduced compared to the Ge—Sb—Te compound thin film formed in the upper portion 330 of the pattern 310. On the other hand, the deposition rate of the Ge—Sb—Te compound thin film formed in the upper portion 330 of the pattern 310 is rapidly reduced compared to the Ge—Sb—Te compound thin film formed in the inside 320 of the pattern 310. Thus, the deposition rate of the Ge—Sb—Te compound thin film formed in the inside 320 of the pattern 310 is greater than that of the Ge—Sb—Te compound thin film formed in the upper portion 330 of the pattern 310, and a process window in which the deposition rate of the Ge—Sb—Te compound thin film corresponds to 0.5 Å/cycle, increases. In other words, the deposition rate of the Ge—Sb—Te compound thin film is the same, and the range of condition of an allowable purge time and pressure inside the reactor 110 becomes wide. Thus, productivity is improved and a defective rate is reduced.

When the Ge—Sb—Te compound thin film is formed according to the present invention, the temperature of the semiconductor substrate W may be set to 150° C. to 400° C., and pressure inside the reactor 110 may be maintained in the range from 0.5 to 10 torr. When the temperature of the semiconductor substrate W is lower than 150° C., reaction is not briskly performed, and the deposition rate of the Ge—Sb—Te compound thin film is so low, and a large amount of C and N is contained in the Ge—Sb—Te compound thin film so that the matter property of the Ge—Sb—Te compound thin film is deteriorated. When the temperature of the semiconductor substrate W is higher than 400° C., an increase in the deposition rate of the Ge—Sb—Te compound thin film causes deterioration of a step coverage, and the matter properties of other thin films formed before the Ge—Sb—Te compound thin film is formed may be deteriorated.

If pressure inside the reactor 110 is smaller than 0.5 torr, the deposition rate of the Ge—Sb—Te compound thin film is rapidly reduced, and if pressure inside the reactor 110 is greater than 10 torr, the deposition rate of the Ge—Sb—Te compound thin film increases and the step coverage may be deteriorated.

Meanwhile, time at which the first purge gas is supplied to the semiconductor substrate W may be set in the range from 0.1 to 5 seconds. If the time at which the first purge gas is supplied to the semiconductor substrate W is less than 0.1 second, a purging operation of the source gas is not sufficiently performed, and ALD is not smoothly performed. If the time at which the first purge gas is supplied to the semiconductor substrate W exceeds 5 seconds, a deposition process is delayed, and productivity is lowered, and desorption of a precursor absorbed into the surface of the semiconductor substrate W occurs, and the deposition rate of the Ge—Sb—Te compound thin film is reduced.

As described above, in the method of forming the chalcogenide thin film according to the present invention, time at which a source gas is purged and pressure inside a reactor are adjusted so that speed at which the chalcogenide thin film is formed inside patterns can be greater than speed at which the chalcogenide thin film is formed on the patterns. As such, the chalcogenide thin film having an excellent gap-fill characteristic can be formed.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of forming a chalcogenide thin film, the method comprising:
   loading a substrate in which a pattern is formed, into a reactor;
   supplying a source gas to the substrate;
   supplying a first purge gas to the substrate so as to purge the source gas supplied to the substrate;
   supplying a reaction gas that is used to reduce the source gas, to the substrate;
   supplying a second purge gas to the substrate so as to purge the reaction gas supplied to the substrate; and
   repeatedly performing a cycle comprising the supplying of the source gas through the supplying of the second purge gas,
   wherein the source gas is formed of one or more selected from the group including germanium (Ge)-based gas, gallium (Ga)-based gas, indium (In)-based gas, selenium (Se)-based gas, antimony (Sb)-based gas, tellurium (Te)-based gas, tartar (Sn)-based gas, silver (Ag)-based gas, and sulfur (S)-based gas, and
   wherein at least one of a time changing operation by which a supply time of the first purge gas is changed whenever the cycle is repeated and a pressure adjustment operation by which the pressure in the reactor is adjusted during the supply of the first purge gas is performed so that a deposition rate of an inside of the pattern is greater than that of an upper portion of the pattern; and
   between the loading of the substrate and the supplying of the source gas, processing a surface of the substrate by generating plasma in the substrate by using a gas containing fluorine (F).

2. The method of claim 1, wherein at least one of the time varying operation and the pressure adjustment operation is performed so that the deposition rate of the inside of the pattern is greater than 0.5 Å per the cycle.

3. The method of claim 1, wherein the supplying of the reaction gas comprises applying a bias voltage to at least one of the reactor and an inside of the reactor 4. The method of claim 1, wherein the time at which the first purge gas is supplied is set in a range from 0.1 to 5 seconds, or pressure inside the reactor is set in a range from 0.5 to 10 torr.

5. The method of claim 1, wherein the chalcogenide thin film is formed of one or more material selected from the group including a Ge—Sb—Te compound, GaSb, InSb, InSe, $Sb_2Te_3GeTe$, $Ge_2Sb_2Te_5$, InSbTe, GaSeTe, $Sn_xb_2Te_4$, InSbGe, AgInSbTe, (GeSn)SbTe, GeSb(SeTe), and $Te_{81}Ge_{15}Sb_2S_2$.

6. The method of claim 1, wherein the Ge-based gas is one or more selected from the group including compounds represented by Formulae 1 through 4 below:

wherein $R_1$ through $R_5$ are each $C_nH_{2n+1}$ or $N(C_nH_{2n+1}*C_mH_{2m+1})$, $R_6$ through $R_{11}$ are each any one of H, $C_nH_{2n+1}$, and $N(C_nH_{2n+1}.C_mH_{2m+1})$, and n and m are natural numbers.

7. The method of claim 1, wherein the Sb-based gas is a compound represented by Formula 5 below

wherein, $R_{12}$ through $R_{14}$ are each any one of H, $C_nH_{2n+1}$ and $N(C_nH_{2n+1}.C_mH_{2m+1})$ and n and m are natural numbers.

8. The method of claim 1, wherein the Te-based gas is a compound, represented by Formula 6 below

wherein $R_{15}$ and $R_{16}$ are each H, $C_nH_{2n+1}$ and $N(C_nH_{2n+1}C_mH_{2m+1})$ and n and m are natural numbers.

9. The method of claim 1, wherein the reaction gas is a compound containing hydrogen (H).

10. The method of claim 1, wherein the first purge gas and the second purge gas are one or more selected from nitrogen ($N_2$), argon (Ar), and helium (He).

11. The method of claim 1, wherein the gas containing F is $NF_3$.

12. The method of claim 1, wherein a temperature of the substrate about when the supplying of the source gas through the repeatedly performing of the cycle is 100° C. to 400° C.

* * * * *